United States Patent
Roth et al.

(10) Patent No.: US 11,061,766 B2
(45) Date of Patent: *Jul. 13, 2021

(54) FAULT-TOLERANT DOT PRODUCT ENGINE

(71) Applicant: Hewlett Packard Enterprise Development LP, Houston, TX (US)

(72) Inventors: Ron M. Roth, Palo Alto, CA (US); Richard H. Henze, San Carlos, CA (US)

(73) Assignee: Hewlett Packard Enterprise Development LP, Houston, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 16/712,358

(22) Filed: Dec. 12, 2019

(65) Prior Publication Data

US 2020/0133997 A1 Apr. 30, 2020

Related U.S. Application Data

(62) Division of application No. 15/664,874, filed on Jul. 31, 2017, now Pat. No. 10,545,821.

(51) Int. Cl.
*G06F 11/00* (2006.01)
*G06F 11/10* (2006.01)
(Continued)

(52) U.S. Cl.
CPC ......... *G06F 11/1068* (2013.01); *G06F 17/16* (2013.01); *G11C 7/1006* (2013.01);
(Continued)

(58) Field of Classification Search
None
See application file for complete search history.

(56) References Cited

U.S. PATENT DOCUMENTS

| 6,901,422 B1 | 5/2005 | Sazegari |
| 8,352,847 B2 | 1/2013 | Gunnam |

(Continued)

FOREIGN PATENT DOCUMENTS

WO 2018/132444 A1 7/2018

OTHER PUBLICATIONS

A. F. Horadam, "Jacobsthal Representation Numbers", 1996, pp. 40-54.

(Continued)

*Primary Examiner* — Mujtaba M Chaudry
(74) *Attorney, Agent, or Firm* — Hewlett Packard Enterprise Patent Department

(57) ABSTRACT

Examples disclosed herein relate to a fault-tolerant dot product engine. The fault-tolerant dot product engine has a crossbar array having a number l of row lines and a number n of column lines intersecting the row lines to form l×n memory locations, with each memory location having a programmable memristive element and defining a matrix value. A number l of digital-to-analog converters are coupled to the row lines of the crossbar array to receive an input signal and a number n of analog-to-digital converters are coupled to the column lines of the crossbar array to generate an output signal. The output signal is a dot product of the input signal and the matrix values in the crossbar array, wherein a number m<n of the n column lines in the crossbar array are programmed with matrix values used to detect errors in the output signal.

18 Claims, 5 Drawing Sheets

(51) Int. Cl.
    *G11C 13/00*     (2006.01)
    *G11C 7/10*      (2006.01)
    *G11C 7/16*      (2006.01)
    *H03M 13/05*     (2006.01)
    *G06F 17/16*     (2006.01)
    *G11C 29/52*     (2006.01)

(52) U.S. Cl.
    CPC ............ *G11C 7/16* (2013.01); *G11C 13/0002* (2013.01); *G11C 13/004* (2013.01); *G11C 13/0007* (2013.01); *G11C 13/0021* (2013.01); *G11C 13/0069* (2013.01); *H03M 13/05* (2013.01); *G11C 29/52* (2013.01); *G11C 2213/71* (2013.01); *G11C 2213/77* (2013.01)

(56) References Cited

U.S. PATENT DOCUMENTS

| | | | |
|---|---|---|---|
| 8,869,008 B2 | 10/2014 | Baum et al. | |
| 9,330,738 B2* | 5/2016 | Taylor, Jr. | G11C 8/12 |
| 2005/0125477 A1 | 6/2005 | Genov et al. | |
| 2011/0029756 A1* | 2/2011 | Biscondi | H03M 13/3715 |
| | | | 712/22 |
| 2012/0101622 A1* | 4/2012 | Yun | H01J 37/3299 |
| | | | 700/110 |
| 2013/0343506 A1* | 12/2013 | Hisamatsu | H03K 21/023 |
| | | | 377/42 |
| 2014/0082455 A1* | 3/2014 | Yosoku | H03M 13/1137 |
| | | | 714/763 |
| 2014/0368455 A1* | 12/2014 | Croisonnier | G06F 3/0488 |
| | | | 345/173 |
| 2016/0336064 A1 | 11/2016 | Seo et al. | |

OTHER PUBLICATIONS

Boser et al., "An Analog Neural Network Processor with Programmable Topology", IEEE Journal of Solid-state Circuits, vol. 26, No. 12, Dec. 1991, pp. 1-9.

D.E. Knuth, "Efficient Balanced Codes", IEEE Transactions on Information Theory, vol. IT-32, No. 1, Jan. 1986, pp. 51-53.

Hu et al., "Dot-Product Engine for Neuromorphic Computing: Programming 1T1M Crossbar to Accelerate Matrix-Vector Multiplication", DAC 2016, Jun. 5-9, 2016, 7 pages.

Katona et al., "Greedy Construction of Nearly Regular Graphs", European J. Combinatorics, vol. 14, 1993, pp. 213-229.

R.M. Roth, "Introduction to Coding Theory", Cambridge University Press, 2006, 12 pages.

Shafiee et al., "ISAAC: A Convolutional Neural Network Accelerator with In-Situ Analog Arithmetic in Crossbars", Oct. 5, 2016, 13 pages.

Zanko et al., "Robust Turbo Analog Error Correcting Codes Based on Analog CRC Verification", IEEE, 2015, pp. 1-14.

Kabatiansky, G. et al., On Codes Correcting Constant Number of Errors in L1 Metric, (Research Paper), 2015, 6 Pgs.

Li, J. et al., A Memristor Crossbar-Based Computation Scheme with High Precision, (Research Paper), Nov. 19, 2016, 6 Pgs.

* cited by examiner

FAULT-TOLERANT DOT PRODUCT ENGINE

BACKGROUND

The need for fast and efficient vector-matrix computations arises in many applications. For example, vector-matrix computations are utilized in data-compression, digital data processing, neural networks, encryption and optimization, among others. Hardware techniques for optimizing these computations have included the use of ASICs, FPGAs, GPUs, and more recently, the design of a Dot-Product Engine based on a crossbar array.

In one example, the crossbar array is a memristive crossbar array having a number of row lines and a number of column lines intersecting the row lines to form a number of junctions, with memristive memory devices coupled at the junctions and programmed with resistance values. An input voltage signal along each row of the crossbar array is weighted by the conductance of the memristive devices in each column and accumulated as the current output from each column to form a dot product.

Inaccuracies while programming the memristive devices in the crossbar array and noise while reading the current output can affect the accuracy of the computations. Inaccuracies may also arise at the junctions if they become shorted, non-programmable or stuck at an open state.

BRIEF DESCRIPTION OF THE DRAWINGS

The present application may be more fully appreciated in connection with the following detailed description taken in conjunction with the accompanying drawings, in which like reference characters refer to like parts throughout, and in which.

DETAILED DESCRIPTION

A Fault-Tolerant Dot-Product Engine ("FT-DPE") is disclosed. The FT-DPE detects and/or corrects computational errors while performing a vector-matrix multiplication using a memristive crossbar array. An input vector u of integers and of length l is desired to be multiplied by an l×k integer matrix A to compute the vector-matrix product uA. Potential inaccuracies in the programming and/or operation of the memristive devices in the memristive crossbar array can lead to an inaccurate computation. As described in more detail herein below, fault tolerance in the computation is introduced by adding redundancy in the matrix implemented by the memristive crossbar array.

With added redundancy in the crossbar array, instead of performing a computation between an input vector of length l and a matrix of length l×k, a computation is performed between the input vector of length l and a matrix of length l×n, with n>k. The first k entries in the computation carry the result of the computation of interest, while the remaining m=n−k entries contain added redundancy symbols that can be used to detect and/or correct computational errors in the first k entries of the computation.

As described in more detail herein below, the input matrix A is encoded with additional entries that result in output codewords that can be used to detect and/or correct errors in the desired computation. The matrix A has its first k columns programmed with the input matrix values for the target computation, while its last m=n−k columns are programmed with values computed according to a desired error correction capability. An encoder circuit encodes the values in the last m columns of the matrix A from its first k columns and a decoder circuit operates to detect and/or correct any errors in the first k entries of the output dot product vector uA.

It is appreciated that, in the following description, numerous specific details are set forth to provide a thorough understanding of the examples. However, it is appreciated that the examples may be practiced without limitation to these specific details. In other instances, well-known methods and structures may not be described in detail to avoid unnecessarily obscuring the description of the examples. Also, the examples may be used in combination with each other.

Figure 1:
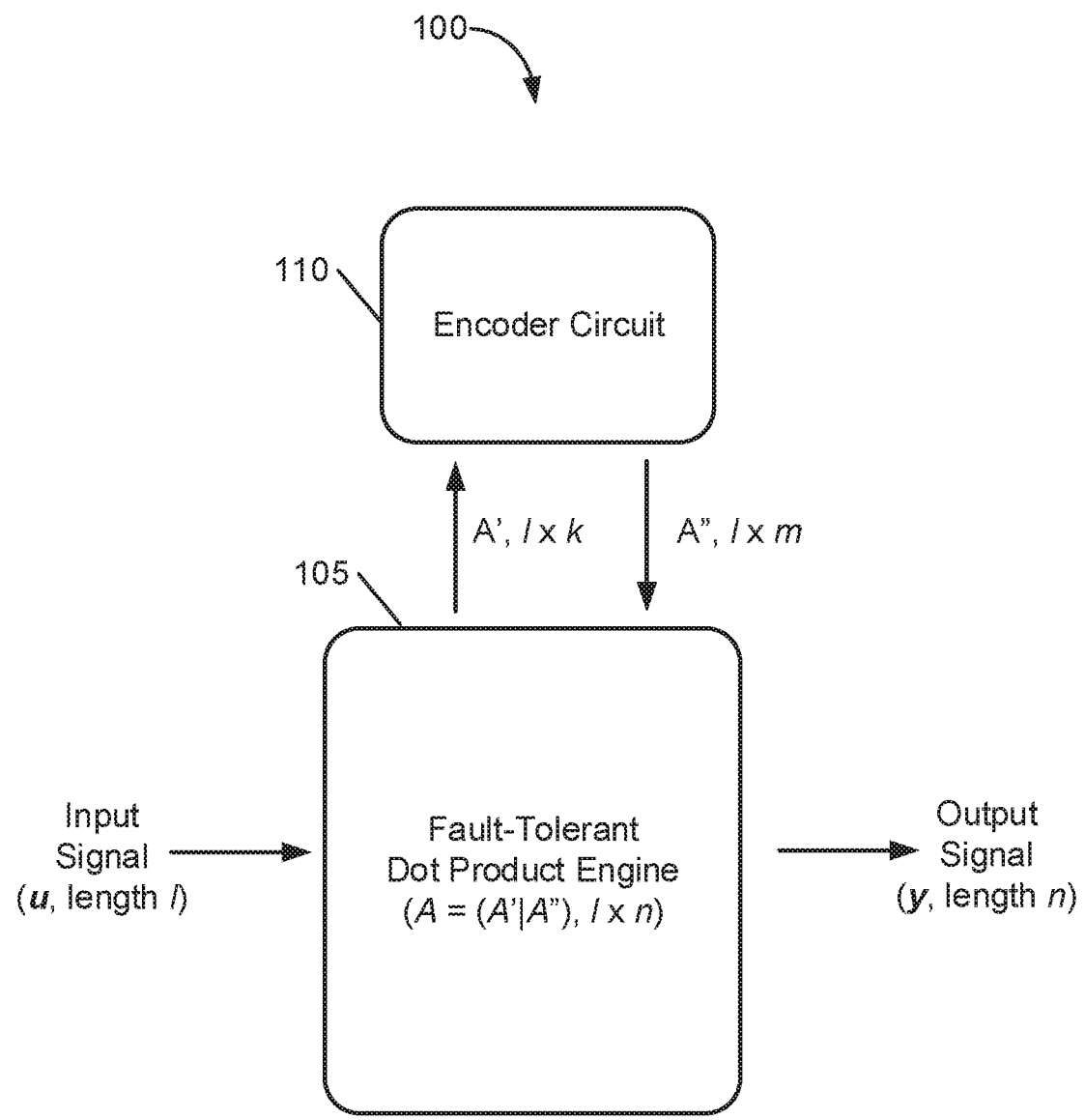
FIG. 1 illustrates a schematic diagram of a fault-tolerant computing device for determining a dot product in accordance with various examples.

Referring now to FIG. 1, a schematic diagram of a fault-tolerant computing device for determining a dot product in accordance with various examples is described. Fault-tolerant computing device 100 includes a fault-tolerant dot product engine ("FT-DPE") 105 and an encoder circuit 110. The FT-DPE 105 receives an input signal corresponding to an input vector u of length l and generates an output signal corresponding to an output vector y of length n that is a dot product between the input signal u and an l×n input matrix A. As described in more detail herein below, the matrix A is implemented as a crossbar array consisting of l row conductors, n column conductors, and programmable memristors at the junctions of the l rows and n columns, thereby forming l×n memory locations. Each memory location is set to have a conductance value that is proportional to the matrix value at that memory location.

Inaccuracies while programming the memristors in the crossbar array and noise while generating the output signal can affect the accuracy of the dot product computation. Errors may also occur as a result of the junctions in the crossbar array becoming shorted due to faults in the programming process. In another example, a junction in the crossbar array may become non-programmable or get stuck in an open state. As a result of these errors, the actual output vector y may differ from the correct dot product uA between the input vector u and the matrix A. For an integer q≥2, let $\Sigma_q$ denote the subset $[q\rangle = \{0, 1, \ldots, q-1\}$ of the integer set Z. The matrix A is an integer matrix whose entries are from the set $\Sigma_q$, for a prescribed alphabet size q.

In order to detect and/or correct for these errors, the matrix A is programmed to be fault-tolerant and self-protect the computations. As described in more detail herein below, the l×n matrix A is programmed to have the following structure:

$$A = (A' | A'') \qquad \text{(Eq. 1)}$$

where A' is an l×k matrix consisting of the first k columns of A, and A" is an l×m matrix consisting of the remaining m=n−k columns and generated by the encoder circuit 110 prior to or while programming A' and A" into the crossbar array.

In various examples, the encoder circuit 110 is a dedicated circuit designed to operate according to a given error detection and correction capability. That is, the encoder circuit 110 is implemented to encode A" so that a given number of errors are able to be detected and/or corrected in the output vector y. Specifically, the difference between the actual output vector y and the correct dot product uA between the input vector a and the matrix A can be expressed as an error vector e:

$$e = y - uA \quad \text{(Eq. 2)}$$

The number of errors in the error vector e can be quantified as the $L_1$ norm of e:

$$\|e\| = \|e\|_1 = \sum_{j \in \{n\}} |e_j| \quad \text{(Eq. 3)}$$

This norm is also referred to as the Manhattan weight of e, which equals the Manhattan distance between uA and y.

In various examples, the encoder circuit 110 can be implemented to enable a decoder to detect and/or correct a number of $L_1$ errors in the output vector y. In other examples, the encoder circuit 110 can also be implemented to enable a decoder to detect and/or correct a number of errors in the Hamming metric. In this case, the number of errors to be detected and/or corrected equals the number of positions in the output vector y that differ from the correct computation vector c=aA.

It is appreciated that the vector c=uA can be expressed as:

$$c = (c'|c'') \quad \text{(Eq. 4)}$$

where c' is a vector of length k representing the result of the computation uA' and the vector c" is a vector of length m=n−k representing the result of the computation u A". It is appreciated that with A" generated by the encoder circuit 110, the vector c" consists of redundancy symbols that can be used to detect and/or correct errors in the vector c', which therefore represents a target dot product computation. That is, the matrix A can be designed to contain a redundant matrix A" of a size l×m, with m=n−k depending on the desired error correction capability.

Figure 2:
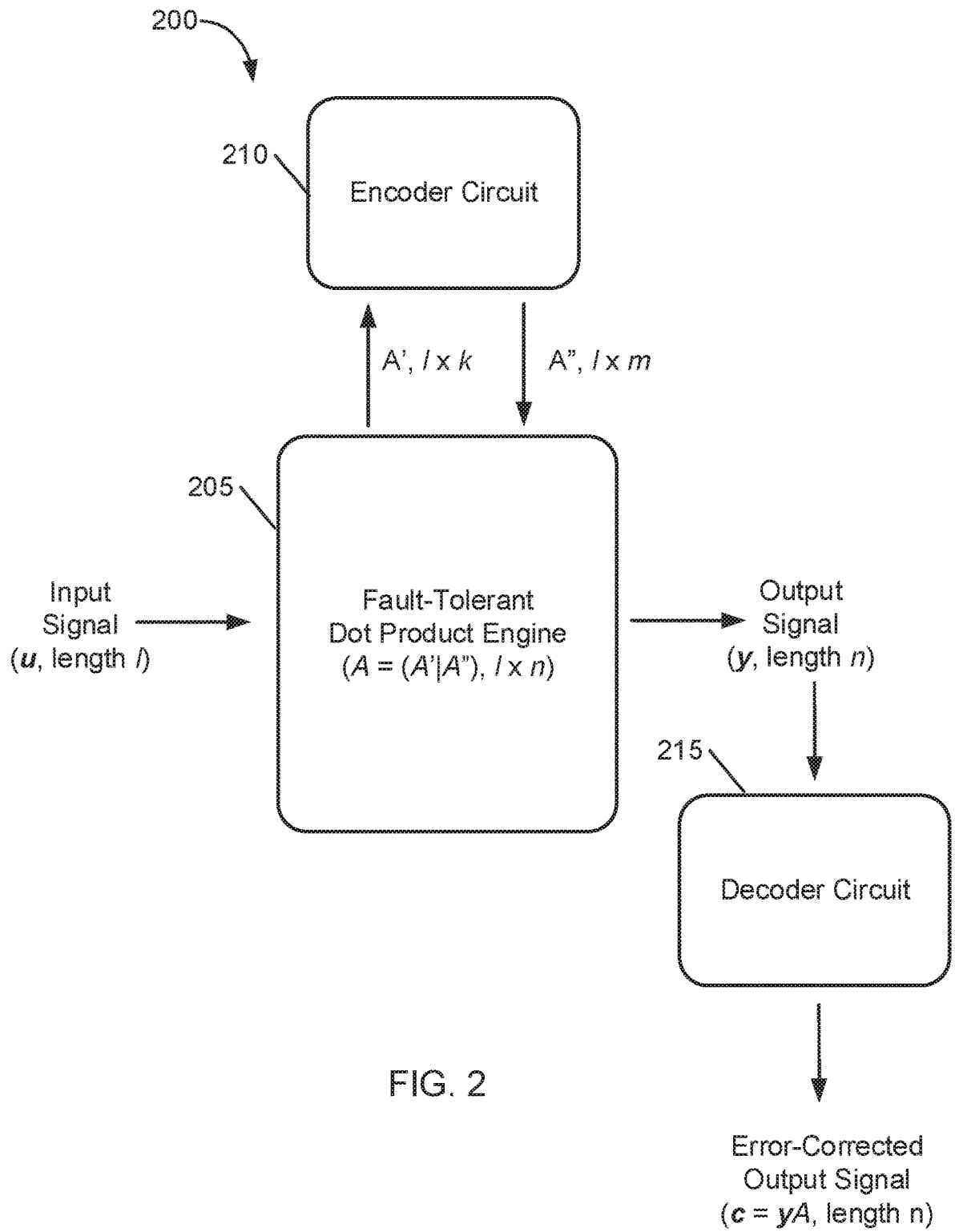
FIG. 2 is a schematic diagram of a fault-tolerant computing device for determining a dot product and detecting and/or correcting errors in the dot product in accordance with various examples.

Referring now to FIG. 2, a schematic diagram of a fault-tolerant computing device for determining a dot product and detecting and/or correcting errors in the dot product in accordance with various examples is described. Fault-tolerant computing device 200 includes FT-DPE 205 and an encoder circuit 210, designed to be substantially similarly to the FT-DPE 105 and the encoder circuit 110 of FIG. 1. The fault-tolerant computing device 200 also includes a decoder circuit 215 to decode the output vector y and generate an error-corrected output vector c'=uA'. Specifically, the decoder circuit 215 decodes the redundancy symbols in c" to produce the error-corrected output vector c'.

As described above, the number of errors that the decoder circuit 210 is able to detect and/or correct depends on the design of the redundant matrix A". In one example, consider the case where the redundant matrix A" is encoded by the encoder circuit 210 to detect up to one $L_1$ error. In this case, the redundant matrix A" is designed to be a matrix of size l×l, with a single column of redundant values added to the input matrix A. The matrix $A''=(a_{i,k})_{i \in [l]}$ is encoded from $A' = (a_{i,j})_{i \in [l], j \in [k]}$ by:

$$a_{i,k} = (\sum_{j \in [k]} a_{i,j}) \bmod 2, i \in [l] \quad \text{(Eq. 5)}$$

where "mod" denotes modulo 2. That is, one would appreciate that the sum of entries along each row of A is even. It follows by linearity that the sum of entries of an error-free output vector $c = (c_j)_{j \in [n]} = u A$ satisfies the following:

$$(\sum_{j \in \{n\}} c_j) \bmod 2 = (\sum_{j \in \{n\}} (\sum_{i \in \{l\}} u_i a_{i,j})) \bmod 2 = (\sum_{i \in \{l\}} u_i \sum_{j \in \{n\}} a_{i,j}) \bmod 2 = 0 \quad \text{(Eq. 6)}$$

It is appreciated that the contents of the redundant matrix A" depends on A', but do not depend on the input signal u. In particular, A" should be set so that the specified error detection and correction capabilities still hold when a is a unit vector. Thus, for every index i, the set of (at least) $q^k$ possible contents of row i in matrix A must form a subset of $E_q^n$ that, by itself (and independently of the contents of the other rows in A), meets the desired error detection and correction capabilities.

An encoding/decoding scheme for correcting one $L_1$ error can be implemented as follows. Given an alphabet size q≥2 and a code length n, let $m = \lceil \log_q(2n+1) \rceil$ and k=n−m (that is, m is the number of columns containing the added redundancy). Let $\alpha = (\alpha_0 \alpha_1 \ldots \alpha_{n-1})$ be a vector in $Z^n$ (where Z is the set of integers) that satisfies the following properties:

(i) The entries of $\alpha$ are non-zero distinct elements in $[2n+1\rangle$.
(ii) For any two indexes i,j∈[n], $\alpha_i + \alpha_j \neq 2n+1$.
(iii) $\alpha_{k+j} = q^j$, for j∈[m].

The entries in a can be referred to as code locators. Code locators that satisfy conditions (i)-(iii) can be constructed for every q≥2. For example:

when $q^{m-1} \leq n$, $\{\alpha_j\}_{j \in [n]} = \{1, 2, 3, \ldots n\}$,
otherwise $\{\alpha_j\}_{j \in [n]} = (\{1, 2, 3, \ldots, n\} \setminus \{2n+1-q^{m-1}\}) \cup \{q^{m-1}\}$ For every $A' = (a_{i,j})_{i \in [l], j \in [k]}$, the last m columns in A=(A'|A") are set so that:

$$\sum_{j \in [m]} a_{i,k+j} \alpha_{k+j} = (-\sum_{j \in [k]} a_{i,j} \alpha_j) \bmod (2n+1), i \in [l] \quad \text{(Eq. 6)}$$

Conversely, a decoding scheme for decoder circuit 215 to detect and/or correct a single error in the $L_1$ metric can be implemented as follows. Let $y = (y_j)_{j \in [n]} = c + e = uA + e$ be the output vector that is read at the output of the FT-DPE 205, where e is an error vector having at most one non-zero entry, equaling ±1. The decoding in decoder circuit 215 starts by computing the syndrome of y, which is defined by:

$$s = (y \cdot \alpha^T) \bmod (2n+1) = (\sum_{j \in \{n\}} y_j \alpha_j) \bmod (2n+1) \quad \text{(Eq. 7)}$$

It follows then that:

$$s = uA\alpha^T + e \cdot \alpha^T \equiv e \cdot \alpha^T (\bmod (2n+1)) \quad \text{(Eq. 8)}$$

One would appreciate that s=0 when e=0. Otherwise, if e has ±1 at position j (and is zero otherwise), then $s \equiv \pm \alpha_j (\bmod (2n+1))$. Hence, due to conditions (i)-(iii) above, the syndrome s identifies the error location j and the error sign uniquely.

It is appreciated that if the coding scheme is to be used to detect two errors (instead of correcting one error), then the decoding mapping can be simplified to just checking whether the syndrome is zero. A non-zero value indicates that at least two errors have occurred.

It is also appreciated that the above encoding and decoding schemes can be enhanced so that more errors can be detected and/or corrected in the output vector. In various examples, enhancing the encoding and decoding schemes may include the application of specific error control codes, such as Berlekamp codes, among others.

Figure 3:
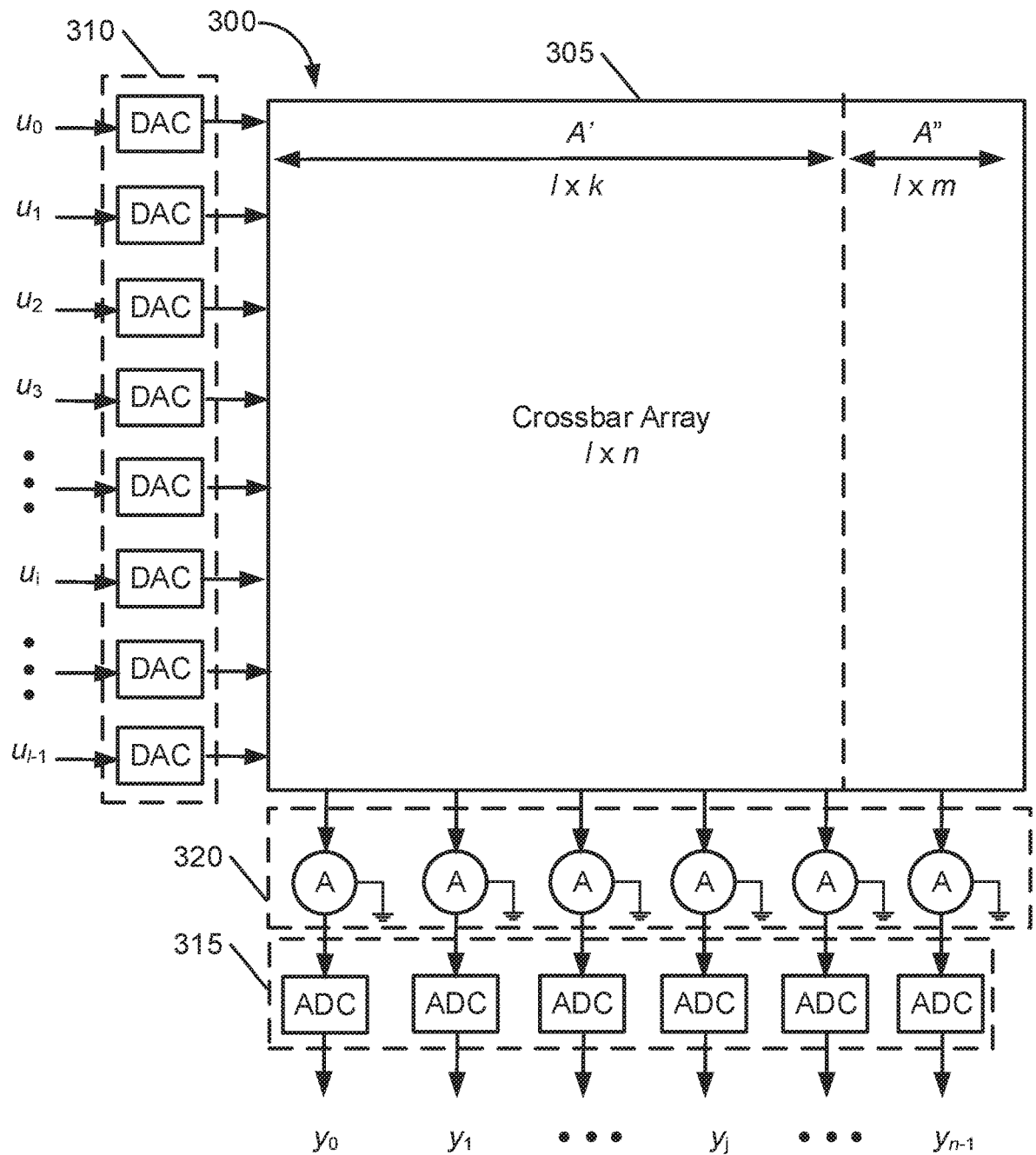
FIG. 3 is a schematic diagram of a fault-tolerant dot product engine in accordance with various examples.

Referring now to FIG. 3, a schematic diagram of a FT-DPE in accordance with various examples is described. FT-DPE 300 is designed to be substantially similar to FT-DPE 105 and FT-DPE 205, and includes a memristive crossbar array 305. The memristive crossbar array 305 has a number l of row lines and a number n of column lines intersecting the row lines to form l×n memory locations, with each memory location having a programming memristive element and defining a matrix value. Each memory location is set to have a conductance value that is proportional to the matrix value at that memory location.

FT-DPE 305 also includes a number l of digital-to-analog converters 310 coupled to the row lines of the memristive crossbar array 305 to receive an input signal a and a number n of analog-to-digital converters 315 coupled to the column lines of the memristive crossbar array 305 to generate an output signal y. As described above, the output signal y is a dot product of the input signal u and the matrix values in the memristive crossbar array 305. The matrix values in the memristive crossbar array 305 represent values in a matrix A expressed as in Eq. 1 above and where A' is an input l×k matrix consisting of the first k columns of A, and A" is an encoded l×m matrix consisting of the remaining m=n−k columns.

Each entry $u_i$ of u is fed into a digital-to-analog converter to produce a voltage level that is proportional to $u_i$. The product, y=uA, is then computed by reading the currents at the (grounded) column conductors 320, after being fed into analog-to-digital converters 315. Any errors in the product y=uA can then be detected and/or corrected by a decoder circuit as described above.

Figure 4:
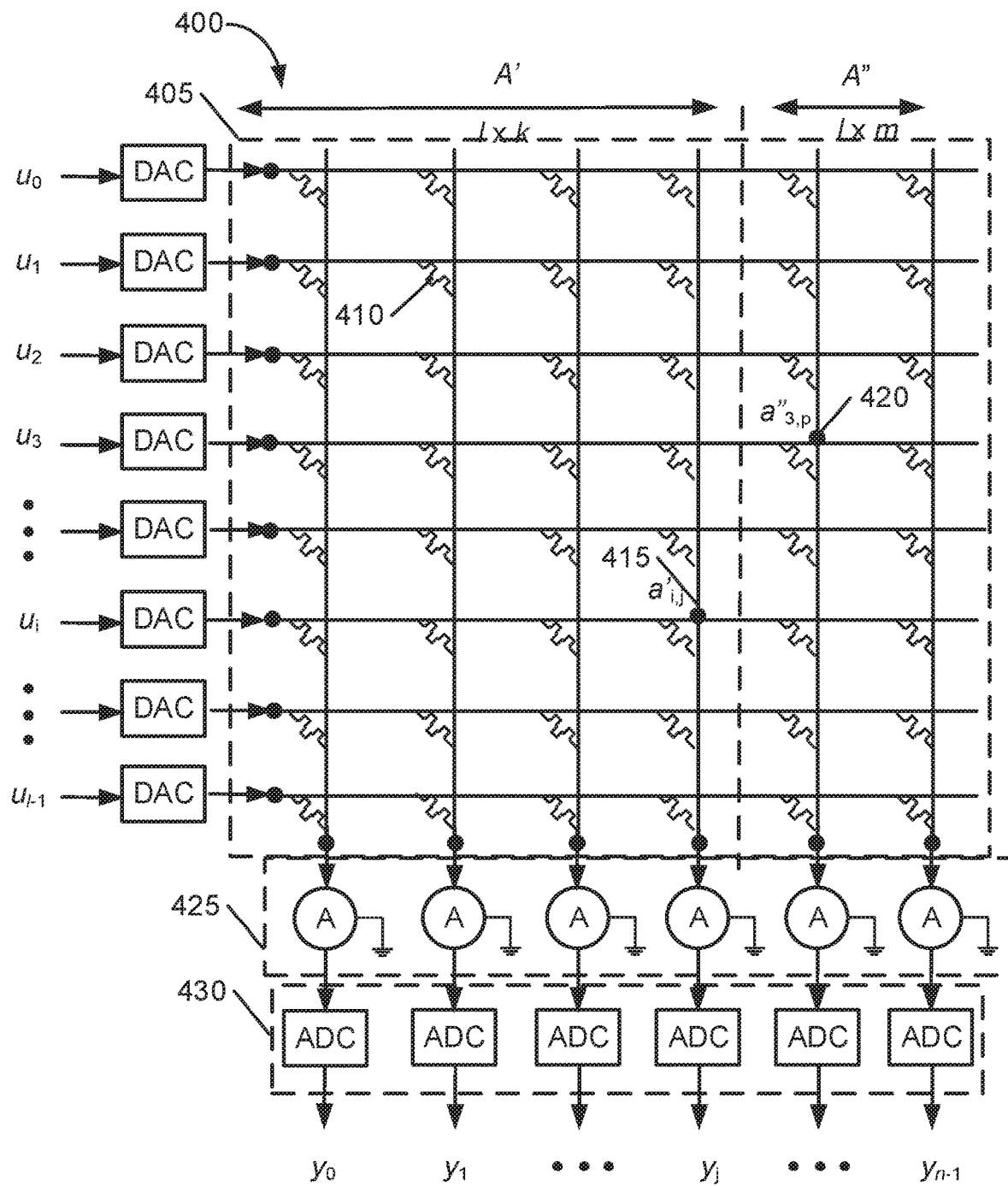
FIG. 4 is a schematic diagram of a fault-tolerant dot product engine in more details.

Attention is now directed at FIG. 4, which shows a schematic diagram of a FT-DPE in more details. FT-DPE 400 is designed to be substantially similar to FT-DPE 105, FT-DPE 205, and FT-DPE 305. FT-DPE 400 includes a memristive crossbar array 405 where memristive elements or memristors are disposed at junctions intersecting and electrically coupling row lines and column lines in the crossbar array 405.

Memristance is a property of the electronic component referred to as a memristor. A memristor is a resistor device whose resistance can be changed. If charge flows in one direction through a memristor circuit, the resistance of the memristor will increase. If charge flows in the opposite direction in the memristor circuit, its resistance will decrease. If the flow of charge is stopped by turning off the applied voltage, the memristor will "remember" the last resistance that it had. When the flow of charge starts again, the resistance of the memristor circuit memory cell will be what it was when it was last active.

Typically, this charge flow must be greater than a certain threshold in order to produce a significant change in the resistance value, for example in order to program a resistance value at each memory location. This threshold operation behavior allows vector-matrix computations to be performed on a Dot-Product Engine below these threshold levels without materially altering the resistance values programmed into the memristor memory array. The array resistance values can subsequently be changed by a programming operation where the charge flow threshold is exceeded.

The conductance channels in the memristors of crossbar array 405 may be formed in each of the memristors, such as, for example, memristor 410. A crossbar can be thought of as an array of memristors that connect each wire in one set of parallel wires (e.g., the row lines) to every member of a second set of parallel wires (e.g., the column lines) that intersects the first set. In the example of FIG. 4, the row lines and the column lines are perpendicular with respect to each other, but the row lines and the column lines may intersect at any angle.

The memristors in crossbar array 405 may be built at the micro- or nano-scale level and used as a component in a wide variety of electronic circuits, such as, for example, bases for memories and logic circuits. When used as a basis for memories, the memristors in crossbar array 405 may be used to store information in the form of resistance values. When used as a logic circuit, the memristors may be employed to represent bits in a field programmable gate array, as the basis for a wired-logic programmable logic array, or, as described herein, as the basis in FT-DPE 405. The memristors in crossbar array 405 may also find use in a wide variety of other applications. Further, the memristors in crossbar array 405 may be fabricated through any reasonably suitable fabrication process, such as, for example, chemical vapor deposition, sputtering, etching, lithography, or other methods of forming memristors.

The memristive crossbar array 405 further includes a number of input values indicated as input signal u. The input values may be read signals used to read the resistance values at each individual memristor at each junction in the crossbar array 405, and as a way to multiply a matrix value by a vector value at each memristor involved in the calculation. The read signals (or vector signals) may be applied as second input values to the row lines of the memristive crossbar array 405. The vector signals may represent a vector to be multiplied to the matrix represented by the program signals. In one example, the vector signals have a relatively lower voltage value than the first voltages used to program the memristors such that the voltage level applied by the vector signals does not change the resistance values of the memristors as programmed by the first voltages. The vector signals act as read signals in this manner by not changing the resistance values of the memristors.

The vector signals interact with the memristors at their respective junctions and the resulting current is collected at the end of each column line by analog current measuring devices 425, which may be, for example, transimpedance amplifiers. The current measured by the devices 425 is then converted into digital values by the analog-to-digital converters 430 to form the output vector y=uA. In various examples, an initial signal may be applied to the memristors before application of the program signals and the vector signals in order to set the resistivity of the memristors to a known value.

Figure 5:
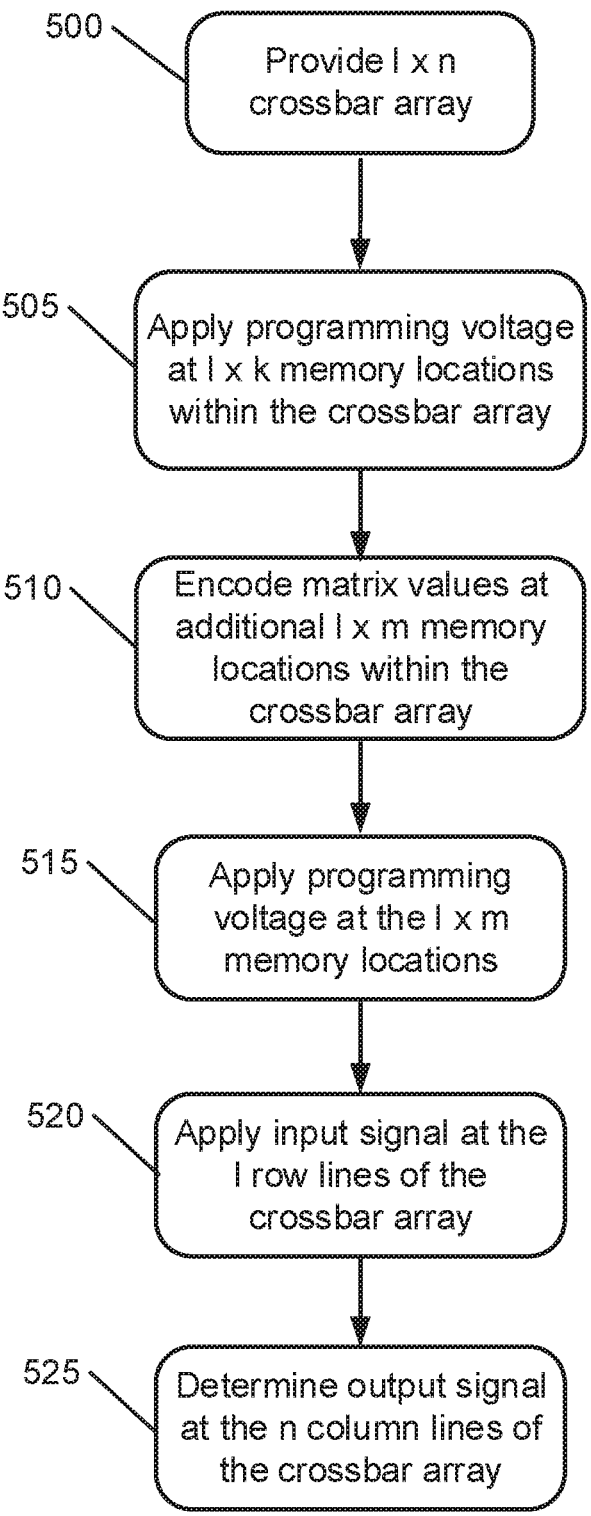
FIG. 5 is a flowchart for detecting and/or correcting errors in a dot product generated by a fault-tolerant dot product engine.

Referring now to FIG. 5, a method for detecting and/or correcting errors in a dot product is now described. First, a crossbar array having a number l of row lines and a number n of column lines intersecting the row lines to form l×n memory locations is provided (500). Each memory location in the crossbar array has a programmable memristive element and defines a matrix value. Next, a programming voltage is applied to the memristive element at each l×k memory location, wherein k<n, to set the matrix values at each memory location (505). The matrix value at each memory location is thus proportional to the conductance of the memristive element in that memory location.

In order to provide fault tolerance in the crossbar array, the crossbar array is designed with additional memory locations to introduce redundancy in the dot product computation that can be used to detect and/or correct errors in the computation. As described above, this is implemented by then encoding matrix values at additional l×m memory locations within the crossbar array from the matrix values at the l×k memory locations according to an error detection capability, wherein n=k+m (510). The encoding is performed by an encoder circuit coupled to the crossbar array. The encoded matrix values are then programmed into the additional l×m memory locations by applying a programming voltage at each additional l×m memory location (515).

As a result of steps 500-515, a fully programmed l×n fault-tolerant crossbar array is provided to perform a dot product computation with an input signal. An input signal is applied at the l row lines of the crossbar array, the input signal corresponding to an input vector of length l to be multiplied by the matrix values at the l×n memory locations (520). The input vector signal interacts with the memristive elements at their respective memory locations and the resulting current is collected at the end of each column line. An output signal is then determined at the n column lines of the crossbar array, the output signal corresponding to an output vector of length n that is a dot product of the input vector and the matrix values at the l×n memory locations (520). The output vector is computed by reading the currents at analog current measuring devices at the end of the n column lines and then converted into digital values by analog-to-digital converters to form a dot product. The dot product is a vector of length n consisting of k values corresponding to a target dot product computation between the input vector and the matrix values programmed into the crossbar array, and an additional m=n−k values that can be used by a decoder circuit to detect and/or correct errors in the k values according to the error detection capability.

The introduction of fault tolerance in the crossbar array to produce a FT-DPE enables (1) faster processing and more energy efficient of a dot product calculation relative to other methods that do not use memristive devices, and (2) efficient error detection and correction in the dot product computation thereby guaranteeing computation reliability, among other advantages.

It is appreciated that the previous description of the disclosed examples is provided to enable any person skilled in the art to make or use the present disclosure. Various modifications to these examples will be readily apparent to those skilled in the art, and the generic principles defined herein may be applied to other examples without departing from the spirit or scope of the disclosure. Thus, the present disclosure is not intended to be limited to the examples shown herein but is to be accorded the widest scope consistent with the principles and novel features disclosed herein.

What is claimed is:

1. A fault-tolerant computing device for determining a dot product, comprising:
   a dot product engine having a number 1 of row lines and a number n of column lines intersecting the row lines to form l×n memory locations in a crossbar array, each memory location comprising a programmable memristive element and defining a matrix value; and
   an encoder circuit to generate matrix values for m of the n columns in the dot product engine based on matrix values for a first k of the n columns and according to an error detection capability, wherein n=k+m.

2. The fault-tolerant computing device of claim 1, wherein the dot product engine comprises:
   a number 1 of digital-to-analog converters coupled to the row lines of the crossbar array to receive an input signal; and
   a number n of analog-to-digital converters coupled to the column lines of the crossbar array to generate an output signal that is a dot product of the input signal and the matrix values in the crossbar array.

3. The fault-tolerant computing device of claim 2, further comprising a decoder circuit to detect and correct errors in output signals generated by the dot product engine.

4. The fault-tolerant computing device of claim 1, wherein the encoder circuit generates the matrix values in the m column lines of the crossbar array from the matrix values in a first number k of column lines of the crossbar array, wherein k=n−m.

5. The fault-tolerant computing device of claim 4, wherein a matrix consisting of the number 1 of row lines and the number n of column lines multiplied by an input vector u corresponding to the input signal generates a vector c' of length k, and wherein the matrix values generated by the encoder multiplied by the input vector u generates a vector c" having redundancy symbols for detecting or correcting errors in c'.

6. The fault-tolerant computing device of claim 5, further comprising a decoder circuit to detect and correct errors of an output signal by decoding the redundancy symbols.

7. The fault-tolerant computing device of claim 1, wherein the encoder circuit generates the matrix values according to a desired number of errors to be detected using a Manhattan distance metric.

8. The fault-tolerant computing device of claim 1, wherein the encoder circuit generates the matrix values according to a desired number of errors to be detected using a Hamming distance metric.

9. A method comprising:
   providing a crossbar array having a number 1 of row lines and a number n of column lines intersecting the row lines to form l×n memory locations, each memory location comprising a programmable memristive element and defining a matrix value;
   generating, by an encoder, matrix values for m of the n columns in the dot product engine based on matrix values for a first k of the n columns and according to an error detection capability, wherein n=k+m.

10. The method of claim 9, further comprising receiving an input signal by a number 1 of digital-to analog converters coupled to the row lines of the crossbar array; and
    generating an output signal that is a dot product of the input signal and the matrix values in the crossbar array.

11. The method of claim 10, further comprising detecting and correcting the output signal generated by the dot product engine.

12. The method of claim 9, further comprising generating, by the encoder circuit, the matrix values in the m column lines of the crossbar array from the matrix values in a first number k of column lines of the crossbar array, wherein k=n−m.

13. The method of claim 12, further comprising multiplying an input vector u corresponding to the input signal with a matrix including the number 1 of row lines and the number n of column lines to generate a vector c' of the length k.

14. The method of claim 13, further comprising generating a vector c" having redundancy symbols for detecting or correcting errors in c' by multiplying the input vector u with the matrix values generated by the encoder.

15. The method of claim 14, further comprising detecting and correcting, by a decoder circuit, errors in output signals generated by the dot product engine.

16. The method of claim 15, wherein the errors are detected and corrected by decoding the redundancy symbols.

17. The method of claim 9, wherein the encoder circuit generates the matrix values according to a desired number of errors to be detected using a Manhattan distance metric.

18. The method of claim 9, wherein the encoder circuit generates the matrix values according to a desired number of errors to be detected using a Hamming distance metric.

* * * * *